United States Patent
Raghavan et al.

(10) Patent No.: US 7,808,842 B1
(45) Date of Patent: Oct. 5, 2010

(54) SYSTEM TO ADJUST A REFERENCE CURRENT

(75) Inventors: Vijay Kumar Srinivasa Raghavan, Colorado Springs, CO (US); Cristinel Zonte, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 102 days.

(21) Appl. No.: 12/207,104

(22) Filed: Sep. 9, 2008

Related U.S. Application Data

(60) Provisional application No. 60/974,993, filed on Sep. 25, 2007.

(51) Int. Cl.
*G11C 16/04* (2006.01)

(52) U.S. Cl. .......................... 365/189.07; 365/189.09; 365/207; 365/205

(58) Field of Classification Search .......... 365/189.07, 365/189.09, 207, 205; 327/52–54
See application file for complete search history.

(56) References Cited

U.S. PATENT DOCUMENTS 6,999,365 B2 * 2/2006 Takano et al. ............... 365/207

\* cited by examiner

*Primary Examiner*—David Lam

(57) ABSTRACT

System and methods to adjust a reference current are disclosed. A current reference circuit generates an adjustable reference current. A microprocessor-based feedback circuit adjusts the reference current, wherein the adjustment is based on read and write parameters attributed to a memory cell.

20 Claims, 2 Drawing Sheets

SYSTEM TO ADJUST A REFERENCE CURRENT

RELATED APPLICATIONS

This application claims the benefit of U.S. Provisional Application No. 60/974,993, filed on Sep. 25, 2007.

TECHNICAL FIELD

This disclosure generally relates to electronic circuits, and particularly, to a system or device including a current reference circuit

BACKGROUND

SONOS (Silicon Oxide Nitride Oxide Silicon) memory is one example of a high performance non-volatile memory, which offers low power usage and a relatively long lifetime. Although SONOS memory was developed as a potential Flash Memory replacement, it is not without faults. During memory read operations, the SONOS memory cell generates read currents that vary significantly across process, voltage and temperature (PVT) corners. In particular, the memory cell currents generated during read operations exhibit significant variations in absolute current value (i.e., magnitude), temperature coefficient (i.e., slope) and polarity (i.e., positive/negative slope). In order to maintain high speed memory sensing, current reference circuits must provide reference currents, which replicate the memory cell current variations.

SUMMARY

Systems and methods for adjusting a reference current are provided. The following is a merely an example embodiment of a system, but is not to be construed in any way to limit the subject matter of the claims. In an embodiment, a system includes a current reference circuit coupled for generating an adjustable reference current and further includes a microprocessor-based feedback circuit coupled for adjusting the reference current, wherein the adjustment is based on read and write parameters attributed to a memory cell.

Figure 1:
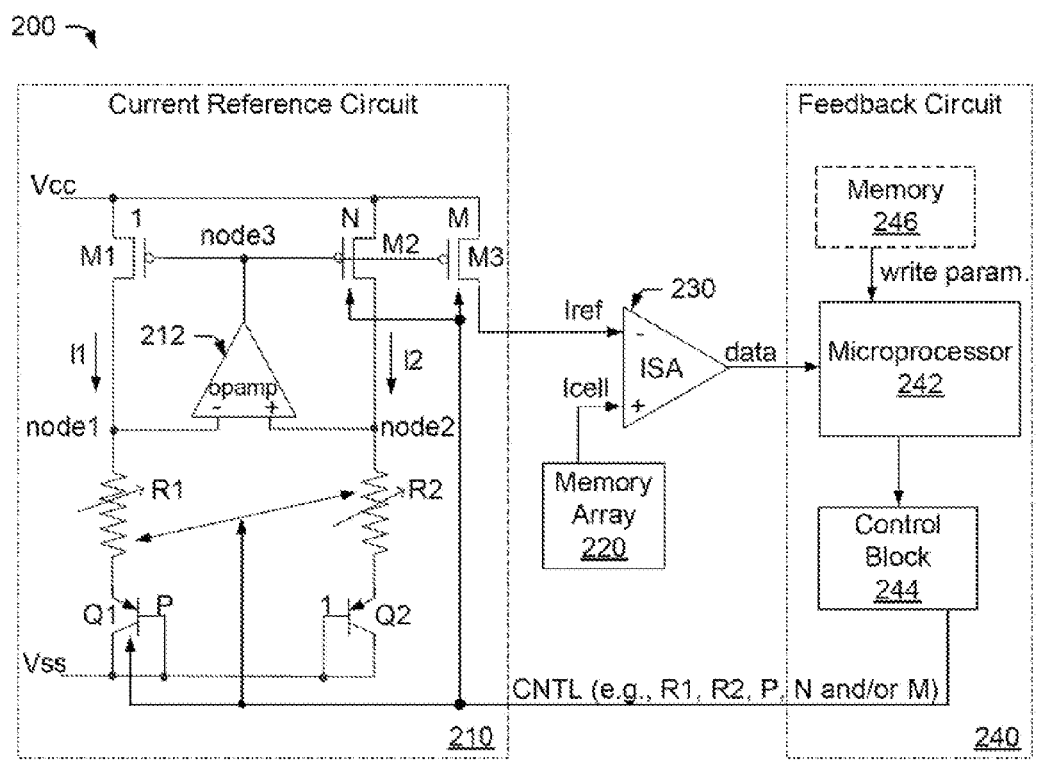
FIG. 1 is a block diagram illustrating an embodiment of a memory system comprising a current reference circuit and feedback circuit with closed loop current sensing and reference current control.

While embodiments of the invention are susceptible to various modifications and alternative forms, specific embodiments thereof are shown by way of example in the drawings and will herein be described in detail. It should be understood, however, that the embodiments described in the drawings and detailed description thereto are not intended to limit embodiments of the invention to the particular form disclosed, but on the contrary, the intention is to cover all modifications, equivalents and alternatives falling within the spirit and scope of the present invention.

DETAILED DESCRIPTION

According to an embodiment, a memory system is provided herein with closed loop current sensing and reference current control. In general, the memory system may include a current reference circuit coupled for providing an adjustable reference current, a memory array coupled for providing a read current from a memory cell, a current sensing circuit coupled for generating read data by comparing the read current to the reference current, and a feedback circuit coupled for adjusting the reference current. As described in more detail below, the feedback circuit may use the read data, along with a number of parameters used to store data within the memory cell, to determine if the reference current needs adjustment. If adjustment is needed, the feedback circuit may adjust one or more parameters (e.g., a magnitude, slope and/or polarity) of the reference current to account for fluctuations in the memory cell current caused by variations in process, voltage and temperature (PVT).

In some cases, the feedback circuit may comprise a microprocessor and a logic control block. The microprocessor may use the read data and the number of parameters used to store the data within the memory cell to determine whether the reference current should be adjusted. The control block may be coupled for supplying one or more control signals to the current reference circuit based on the determination made by the microprocessor. In some embodiments, the control block may comprise logic and a plurality of switches configured for selectively supplying the one or more control signals to the current reference circuit.

In some cases, the current reference circuit may comprise a plurality of current branches. For example, a first branch may include a first bipolar junction transistor (BJT) coupled in series with a first resistor for generating a first current. A second branch may include a second bipolar junction transistor (BJT) coupled in series with a second resistor for generating a second current. A current mirror circuit may be included for generating the reference current by mirroring the currents in the first and second branches to a third branch. An operational amplifier may be included between a pair of nodes located within the first and second branches for amplifying any potential differences and providing a gate bias to the current mirror transistors.

The current reference circuit is coupled for receiving the one or more control signals from the control block and configured for adjusting the reference current in response thereto. In some cases, the control signals from the control block may be used to adjust a resistance value provided by the first and/or the second resistor. In some cases, the control signals from the control block may be used to adjust a current density provided by the first and/or the second bipolar junction transistors. In some cases, the control signals from the control block may be used to adjust a current density provided by at least one transistor within the current mirror circuit.

A method for adjusting a reference current is also provided herein. According to an embodiment, the method may include generating read data by comparing a read current from a memory cell to the reference current, comparing the read data to one or more parameters used to store data within the memory cell, and adjusting the reference current based on said comparison.

In some cases, the reference current may be adjusted by changing at least one parameter of the reference current including a magnitude, a slope and a polarity of the reference current. For example, the reference current may be adjusted by supplying one or more control signals to a current reference circuit used for generating the reference current. As noted above, the current reference circuit may include a plurality of resistors providing variable resistance and a plurality of transistors providing variable current density. In some cases, the reference current may be adjusted by supplying the control signals to at least one of the plurality of resistors for varying the resistance provided thereby. In other cases, the reference current may be additionally or alternatively adjusted by supplying the control signals to at least one of the plurality of transistors for varying the current density provided thereby.

According to an embodiment, the systems and methods described herein may be used for adjusting the reference current generated during non-volatile memory read operations, so that the reference current tracks variations in memory cell current over process, voltage and temperature (PVT) corners. In particular, the systems and methods described herein may be used to dynamically adjust one or more reference current parameters, such as variable slope (also referred to herein as variable temperature coefficient), polarity and current magnitude. In some embodiments, the reference current parameters are controlled by read and write characteristics of the non-volatile memory cell.

An embodiment of a memory system 200 in accordance with the present invention is shown in FIG. 1 as comprising a current reference circuit 210, a memory array 220, a current sensing circuit 230 and a feedback circuit 240 with closed loop reference current control. The current sensing circuit 230 is coupled for receiving a reference current (Iref) from the current reference circuit 210 and a memory cell current (Icell) from the memory array 220. The feedback circuit 240 is coupled for receiving read characteristics from the current sensing circuit 230 and write characteristics from an on-chip source. As described in more detail below, the feedback circuit 240 may use the read/write characteristics to determine if the reference current needs adjustment. If there is to be adjustment, the feedback circuit 240 may provide a control signal (CNTL) to the current reference circuit 210 for adjusting one or more parameters (including, e.g., a temperature coefficient polarity parameter, a current magnitude parameter and a variable slope parameter) of the reference current.

According to an embodiment, the current reference circuit 210 may generate a reference current (Iref) by means of a PTAT voltage generator, a potential difference amplifier with feedback and a feedback-controlled current mirror. Another current reference circuit is described in commonly assigned U.S. application Ser. No. 11/904,642. The current reference circuit described herein includes the circuit components that provide a high degree of adjustability. This enables the current reference circuit described herein to provide a highly adjustable reference current, whose parameters may be varied "on-the-fly" to better account for dynamic variations in PVT.

Although described in the context of a particular current reference design, one skilled in the art would understand how the current reference circuit described herein could be modified or replaced with a completely different current generation scheme. In fact, substantially any current generation circuit could be used, as long as the circuit provides a current with highly adjustable magnitude, slope (temperature coefficient) and polarity parameters.

In the embodiment of FIG. 1, current reference circuit 210 comprises a PTAT voltage generator portion that includes a pair of PNP bipolar junction transistors (BJTs) Q1 and Q2 and a pair of variable resistors R1 and R2. Variable resistor R1 is coupled in series with BJT Q1 between a first node (node1) and ground (vss) for providing a first potential at the first node. Variable resistor R2 is coupled in series with BJT Q2 between a second node (node2) and ground (vss) for providing a second potential at the second node. The BJT transistors (Q1 and Q2) are configured with different base-emitter areas so that they provide different current densities (P:1 respectively), and thus, different base-emitter voltage ($V_{eb}$) drops. The variable resistors are formed from two different materials, so that they provide different temperature coefficients. As described in more detail below, the resistance provided by the variable resistors (R1 and R2) and/or the current density ratio between the BJT transistors (Q1 and Q2) may be adjusted to create reference currents with variable temperature coefficient, polarity and magnitude.

An operational amplifier 212 is included within the current reference circuit for amplifying the potential difference between nodes 1 and 2 and for supplying the difference to a feedback controlled current mirror circuit. In FIG. 1, the current mirror circuit comprises a first PMOS transistor (M1) in a first current branch, a second PMOS transistor (M2) in a second current branch and a third PMOS transistor (M3) in a third current branch. The source terminals of transistors M1, M2 and M3 are coupled to a supply voltage (vcc). The gate terminals of transistors M1, M2 and M3 are coupled together for receiving a gate bias from operational amplifier 212. As described in more detail below, transistors M1, M2 and M3 have distinct device area factors (e.g., 1, N and M, respectively), which may be adjusted to create reference currents with variable temperature coefficient, polarity and magnitude.

In the embodiment of FIG. 1, transistor M1 is coupled to an inverting input terminal (−) of the operational amplifier 212 for generating a first current (I1) through node1. Transistor M2 is coupled to a non-inverting input terminal (+) of the operational amplifier 212 for generating a second current (I2) through node2. As currents I1 and I2 flow through the PTAT voltage generators (R1/Q1 and R2/Q2), the difference in emitter-to-base voltages ($\Delta V_{eb}$) of the two BJTs causes a PTAT component to be created. Due to negative feedback action, the operational amplifier 212 attempts to equalize the voltages at node1 and node2 and provide a gate bias to a third node (node3), which is common to transistors M1, M2 and M3. Transistor M3 is coupled for generating the reference current (Iref) by mirroring the currents I1 and I2 to an output node of the current reference circuit.

The current sensing circuit 230 is coupled to the current reference circuit 210 for receiving the reference current (Iref), and coupled to the memory array 220 for receiving a read current (Icell). In general, the current sensing circuit 230 may include a current sense amplifier (e.g., a differential amplifier) for generating read data by comparing the read current to the reference current. In an embodiment, the current sense amplifier may be similar to the one described in commonly assigned U.S. application Ser. No. 11/973,696. However, one skilled in the art would understand how alternative implementations of a current sense amplifier may be used without departing from the scope of the embodiments of the invention.

In general, the memory array 220 may comprise a plurality of volatile or non-volatile memory cells. In some embodiments, non-volatile memory cells may be particularly useful, as these cells tend to produce read currents that vary widely over PVT corners. In some embodiments, the memory array 220 may comprise a plurality of a non-volatile memory cells implemented in accordance with SONOS, floating gate Flash, Magnetic RAMs and other non-volatile technologies that use current sensing read schemes. In such embodiments, the read current mentioned above is the current that is generated through a non-volatile memory cell when the memory cell is accessed during a read operation. In other words, the read current provided by the memory array 220 is the current that is due to a memory read operation and not due to a non-volatile memory write operation.

The feedback system 240 comprises a microprocessor 242 and a logic-based control block 244. As shown in FIG. 1, the microprocessor 242 is coupled for receiving a plurality of memory cell characteristics, including read parameters and write parameters. For instance, the microprocessor is coupled for receiving read data (data) from the current sensing circuit 230. The microprocessor is also coupled for receiving one or more "write parameters" from an internal (i.e., internal to microprocessor 242) or external (246) memory component. These parameters are typically stored when the data is written to the memory cell and may include various signals, states or status indications that were used (or which occurred) during the write operation. In an embodiment, the write parameters may include a memory cell write signal (i.e., "write data"), a first status signal for a memory program state (e.g., the high voltages and pulse widths required for program operations) and a second status signal for a memory erase state (e.g., the high voltages and pulse widths required for erase operations). However, one skilled in the art would understand that other write parameters may be included appropriate.

The microprocessor 242 uses the various read and write parameters to determine whether the reference current (Iref) needs adjustment. For example, the microprocessor may compare the read data to the write data for generating a PASS/FAIL signal (i.e., a signal indicative of whether the read data matches data stored within the memory cell). If the read data does not match the write data (i.e., if a FAIL signal is generated), the microprocessor may determine that the reference current needs adjustment. If there is to be adjustment, the microprocessor supplies a signal to the control block 244 indicating how the adjustment should be made. In some cases, the microprocessor may use one or more of the other write parameters (e.g., the first and/or second status signals) to indicate to the control block how the reference current settings can be optimized.

Logic control block 244 is coupled for supplying one or more control signals (CNTL) to the current reference circuit 210, and more specifically, to one or more variable components within current reference circuit 210. For instance, the output terminal of the control block 244 is shown in FIG. 1 as being coupled to variable resistors R1 and R2 (at a variable resistance node), current mirror transistors M2 and M3 and bipolar junction transistor Q1. Such coupling allows the logic control block 244 to adjust the reference current (Iref) by changing the resistance (R1, R2) of the variable resistors, the current density (N and/or M) provided by the current mirror transistors and/or the current density (P) provided by the bipolar transistor. According to an embodiment, the control block 244 may include logic and a plurality of switches for supplying the appropriate control signals to the components within the current reference circuit 210. However, one skilled in the art would understand how the control block may be implemented differently in other embodiments of the invention.

The closed loop feedback circuit 240 shown in FIG. 1 is able to adjust the magnitude, slope and polarity of the reference current (Iref) generated by the current reference circuit 210. Adjustment of the reference current parameters can be made by varying the resistance of the resistors (R1, R2), the current density (N and/or M) provided by the current mirror transistors (M2, M3) and/or the current density (P) provided by the bipolar transistor (Q1). For example, the magnitude of the reference current can be changed by varying the device area, and thus, the current density (M) of current mirror transistor M3. The closed loop feedback circuit also enables the current reference circuit to generate currents having a wide range of temperature coefficients including positive, zero and negative slopes.

A detailed description of how the closed loop current sensing system of FIG. 1 can be used to adjust the reference current parameters is provided below in reference to equations 1-5. The reference current (Iref) generated by the current reference circuit 210 is set forth in Eqn. 1 as:

$$Iref = \frac{M\left(\frac{KT}{q}\right)\ln(NP)}{R_{10}[1+\alpha_1(T-T_0)] - NR_{20}[1+\alpha_2(T-T_0)]} \rightarrow \text{Eqn. 1}$$

where,

| | |
|---|---|
| T = | absolute temperature |
| $R_{10}$, $R_{20}$ = | resistance of resistors R1 and R2 at ambient temperature $T_0$ |
| $\alpha_1$, $\alpha_2$ = | temperature coefficient of resistors R1 and R2, respectively |
| K = | Boltzman's constant |
| q = | electron charge |
| P = | base emitter area ratio of Q1 to Q2 |
| M = | device area factor ratio of M3 to M1 |
| N = | device area factor ratio of M2 to M1. |

As indicated in Eqn. 1, the magnitude of the reference current is most easily changed by varying the current density (M) provided by current mirror transistor M3 (note: smaller magnitude adjustments can be achieved by changing the N and/or P device areas). This can be achieved by supplying an appropriate control signal to a plurality of switches (not shown) coupled for increasing or decreasing the area of transistor M3. For example, transistor M3 may actually comprise a number of substantially identical transistors, which are coupled in parallel. Each of the parallel-coupled transistors may be further coupled to one of the plurality of switches. In this manner, the area of transistor M3 may be adjusted by activating a select number of the switches, causing a select number of the parallel-coupled transistors to contribute to the reference current. In some embodiments, the current density (M) provided by current mirror transistor M3 may be increased by activating a larger number of switches.

Eqn. 1 shows the general expression of the reference current provided by the current reference circuit 210. Differentiating with respect to temperature (T) makes the expression independent of temperature and permits the temperature variable to be eliminated as shown in Eqn. 2:

$$\frac{\partial Iref}{\partial T} = 0 \implies \frac{R_{10}}{R_{20}} = N\left[\frac{1-\alpha_2 T_0}{1-\alpha_1 T_0}\right] \rightarrow \quad \text{Eqn. 2}$$

The temperature-independent current condition shown in Eqn. 2 results in a constant reference current, which is independent of process, voltage and temperature (PVT) corners. The constant reference current is shown in the Eqn. 3 as:

$$Iref = \frac{M\left(\frac{K}{q}\right)\ln(NP)}{\alpha_1 R_{10} - \alpha_2 NR_{20}} \rightarrow \quad \text{Eqn. 3}$$

Eqn. 3 represents the case in which a reference current is generated with zero slope (i.e., the temperature coefficient of the reference current does not vary with temperature). Conditions for positive and negative temperature coefficients of the reference current are shown in Eqns. 4 and 5, respectively.

$$\frac{\partial Iref}{\partial T} > 0 \Longrightarrow \frac{R_{10}}{R_{20}} > N\left[\frac{1-\alpha_2 T_0}{1-\alpha_1 T_0}\right] \rightarrow \quad \text{Eqn.4}$$

$$\frac{\partial Iref}{\partial T} < 0 \Longrightarrow \frac{R_{10}}{R_{20}} > N\left[\frac{1-\alpha_2 T_0}{1-\alpha_1 T_0}\right] \rightarrow \quad \text{Eqn.5}$$

As indicated in Eqns. 2-5, the slope and polarity of the reference current can be adjusted by changing the resistance ($R_{10}$, $R_{20}$) of the variable resistors (R1, R2) and/or the current density (N) of current mirror transistor M2. For example, the resistance of R1 and/or R2 may be adjusted by supplying an appropriate control signal to a variable resistance node. The current density (N) of current mirror transistor M2 may be adjusted by supplying an appropriate control signal to a plurality of switches (not shown) coupled for increasing or decreasing the area of transistor M2.

In some embodiments, feedback control signals may be generated for adjusting all of the reference current parameters (e.g., magnitude, slope and polarity) generated by circuit 210. In other embodiments, it may only be appropriate to adjust one or two parameters of the reference current (e.g., slope and polarity). The amount of adjustment depends on how well the reference current is currently tracking the memory cell current variations.

Figure 2:
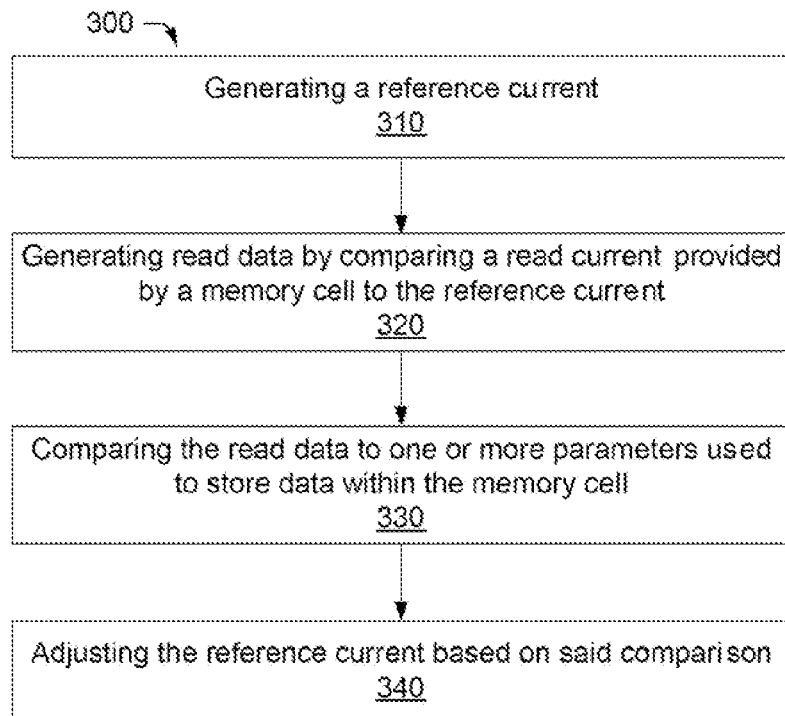
FIG. 2 is a flow chart depicting an embodiment of a method for adjusting a reference current.

FIG. 2 shows a flow chart 300, which depicts an embodiment of a method for adjusting a reference current in accordance with a closed loop current sensing scheme. In some embodiments, the method may begin (in block 310) by generating a reference current with adjustable magnitude, slope (temperature coefficient) and polarity. The reference current may be generated by current reference circuit 210, or any other current generation circuit capable of providing a current with highly adjustable magnitude, slope and polarity parameters. Next, the method may generate read data (in block 320) by comparing a memory cell read current to the reference current. In an embodiment, the read data may be generated by a current sense amplifier. Once generated, the read data may be compared with one or more parameters used to store data within the memory cell (in block 330). For example, the read data may be compared with the "write data," or the data written to the memory cell, to determine if the read operation was successful (i.e., if the read data matches the write data). If the read operation is not successful, the method may adjust one or more parameters of the reference current (in block 340). In some embodiments, the comparison process may take other write parameters into consideration (such as status signals for both erase and programmed states of the memory cell) when determining if and how much the reference current should be adjusted.

In some embodiments, the process of adjusting the reference current comprises changing a magnitude, a slope and a polarity of the reference current. As noted above, for example, the reference current may be adjusted by supplying one or more control signals to a current reference circuit (210) used for generating the reference current. The current reference circuit may include a plurality of resistors providing variable resistance and a plurality of transistors providing variable current density. In some embodiments, the reference current may be adjusted by supplying control signals to at least one of the plurality of resistors for varying the resistance provided thereby. In some cases, the reference current may be additionally or alternatively adjusted by supplying the control signals to at least one of the plurality of transistors for varying the current density provided thereby. In some embodiments, the reference current may be further adjusted by optically or electrically trimming the reference current.

The closed loop current sensing system described herein provides many advantages over conventional memory systems, which utilize open loop current sensing. One benefit of the closed loop current sensing system is that it enables the reference current to track dynamic variations in memory cell currents. The reference current adjustment can be implemented at sort or in the field, and uses only linear terms (e.g., R1, R2, N, M or P) to provide a wide range of temperature coefficient, polarity and absolute current values. Another benefit of the closed loop current sensing system is that it uses microprocessor-based feedback control to provide optimal reference current settings, which are based on memory cell read/write characteristics. The microprocessor based feedback system maximizes read access speed and sense margin by accurately compensating for memory cell current changes over process, voltage and temperature (PVT) corners. Another benefit is that manufacturing and testing costs of the closed loop current sensing circuit are reduced by automatically trimming the reference current. In some embodiments, the reference current may be further adjusted by optical or electrical trimming means, if such means are deemed appropriate. Other advantages may become apparent in light of the disclosure set forth herein.

In accordance with an embodiment of the invention, the reference current used in a non-volatile memory read scheme is controlled by a closed loop feedback system having an embedded microprocessor. The feedback control signals are based on memory read operations and memory write parameters. The feedback control signals are supplied to a current reference circuit for adjusting the reference current generated therein. In an embodiment, the architecture of the current reference circuit is based on variable resistors and transistors having variable current densities. The feedback control signals may be supplied to the resistors and/or the transistors for varying the magnitude, slope and/or polarity of the reference current.

In accordance with an embodiment of the invention, the reference current parameters are controlled by the read/write characteristics of a SONOS memory cell. However, the system and method described herein is not restricted to SONOS memory and may be applied to other volatile and non-volatile memory sensing schemes. In addition, the system and method is not strictly limited to memory applications and may be applicable to other systems and devices that use dynamically controlled reference current.

It will be appreciated to those skilled in the art having the benefit of this disclosure that embodiments of this invention are believed to provide a system and method for closed loop current sensing and reference current control. Further modifications and alternative embodiments of various aspects of the invention will be apparent to those skilled in the art in view of this description. For example, one skilled in the art would understand how the current reference circuit shown in FIG. 1 could be modified or replaced with a somewhat different current generation scheme. For instance, a skilled artisan would recognize that a PTAT voltage could be generated by replacing the bipolar junction transistors (Q1, Q2) with diodes. In addition, one skilled in the art would recognize how the current reference circuit could be modified, so as to include NMOS rather than PMOS current mirror devices.

Figure 3:
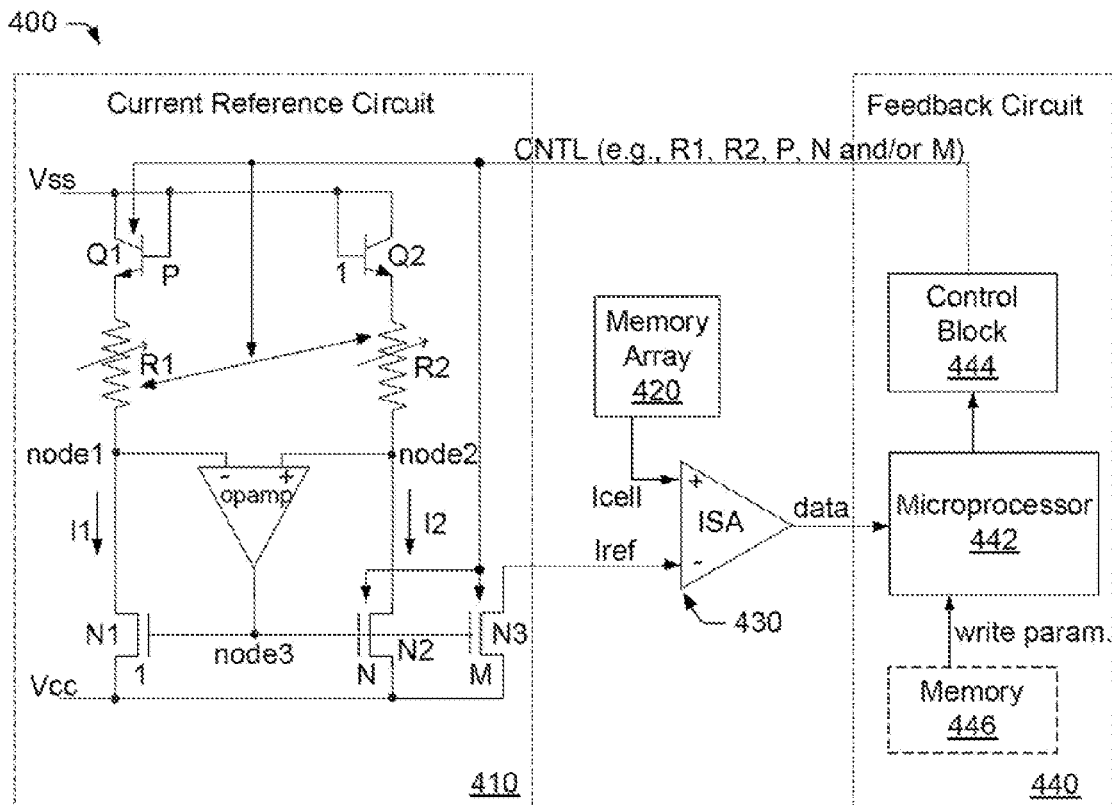
FIG. 3 is a block diagram illustrating another embodiment of a memory system comprising a current reference circuit and feedback circuit with closed loop current sensing and reference current control.

Another embodiment of a memory system 400 providing closed loop current sensing and reference current control is illustrated in FIG. 3. Although memory system 400 is similar to memory system 200, the closed loop current sensing system shown in FIG. 3 is implemented using NPN BJTs and NMOS current mirrors. One may choose an NPN embodiment (FIG. 3) over a PNP embodiment (FIG. 2) to match the bulk process being used for the integrated circuit (i.e., an n-type substrate process versus a p-type substrate process).

Like the previous embodiment, memory system 400 comprises a current reference circuit 410, a memory array 420, a current sensing circuit 430 and a closed loop feedback control circuit 440. The current sensing circuit 430 is coupled for receiving a reference current (Iref) from the current reference circuit 410 and a read current (Icell) from the memory array 420. The feedback circuit 440 is coupled for receiving read characteristics (e.g., read data) from the current sensing circuit 430 and write characteristics (e.g., write data and possibly one or more status signals) from an on-chip source. As described in more detail above, the feedback circuit 440 may use the read/write characteristics to determine if the reference current needs adjustment. If there is to be adjustment, the feedback circuit 440 may provide a control signal (CNTL) to the current reference circuit 210 for adjusting one or more parameters (including, e.g., a temperature coefficient polarity parameter, a current magnitude parameter and a variable slope parameter) of the reference current. Reference can be made to the description provided above for a more detailed operation of memory system 400.

Embodiments of the present invention are well suited to performing various other processes or variations thereof, and in a sequence other than that depicted and/or described herein. For purposes of clarity, many of the details of the closed loop current sensing and reference control system that are widely known and are not relevant to embodiments of the present invention have been omitted from the description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects may lie in less than all features of a single foregoing disclosed embodiment. Thus, the claims following the detailed description are hereby expressly incorporated into this detailed description, with each claim standing on its own as a separate embodiment of this invention.

What is claimed is:

1. A system, comprising:
    a current reference circuit coupled for generating an adjustable reference current; and
    a microprocessor-based feedback circuit coupled for adjusting the reference current, wherein said adjustment is based on read and write parameters attributed to a memory cell.

2. The system as recited in claim 1, wherein the system further comprises:
    a memory array coupled for providing a read current from the memory cell; and
    a current sensing circuit coupled for generating read data by comparing the read current to the reference current.

3. The system as recited in claim 2, wherein the microprocessor-based feedback circuit comprises:
    a microprocessor coupled for determining whether the reference current should be adjusted, wherein said adjustment is based on the read data and a number of write parameters used to store data within the memory cell; and
    a control block coupled for supplying one or more control signals to the current reference circuit based on the determination made by the microprocessor.

4. The system as recited in claim 3, wherein the current reference circuit is coupled for receiving the one or more control signals from the control block and configured for adjusting the reference current in response thereto.

5. The system as recited in claim 4, wherein the current reference circuit uses the one or more control signals to adjust a resistance provided by one or more resistors included within the current reference circuit.

6. The system as recited in claim 4, wherein the current reference circuit uses the one or more control signals to adjust a current density provided by one or more transistors included within the current reference circuit.

7. A system, comprising:
    a current reference circuit coupled for providing an adjustable reference current;
    a memory array coupled for providing a read current from a memory cell;
    a current sensing circuit coupled for generating read data by comparing the read current to the reference current; and
    a feedback circuit coupled for adjusting the reference current, wherein said adjustment is based on the read data and a number of parameters used to store data within the memory cell.

8. The system as recited in claim 7, wherein the memory array comprises a plurality of volatile or non-volatile memory cells.

9. The system as recited in claim 7, wherein the memory array comprises a plurality of non-volatile memory cells selected from a group comprising SONOS memory cells, floating gate FLASH memory cells and Magnetic RAM memory cells.

10. The system as recited in claim 7, wherein the feedback circuit comprises:
    a microprocessor coupled for using the read data and the number of parameters used to store the data within the memory cell to determine whether the reference current should be adjusted; and
    a control block coupled for supplying one or more control signals to the current reference circuit based on the determination made by the microprocessor.

11. The system as recited in claim 10, wherein the control block comprises logic and a plurality of switches configured for selectively supplying the one or more control signals to the current reference circuit.

12. The system as recited in claim 10, wherein the current reference circuit comprises:

a first branch comprising a first bipolar junction transistor (BJT) coupled in series with a first resistor for generating a first current;

a second branch comprising a second bipolar junction transistor (BJT) coupled in series with a second resistor for generating a second current;

a current mirror circuit coupled for generating the reference current by mirroring the currents in the first and second branches to a third branch; and an operational amplifier coupled for amplifying any potential differences generated between the first and second branches and for providing a gate bias to the current mirror circuit.

13. The system as recited in claim 12, wherein the current reference circuit uses the one or more control signals to adjust a resistance value provided by at least one of the first and second resistors.

14. The system as recited in claim 12, wherein the current reference circuit uses the one or more control signals to adjust a current density provided by at least one of the first and second bipolar junction transistors.

15. The system as recited in claim 12, wherein the current reference circuit uses the one or more control signals to adjust a current density provided by at least one transistor within the current mirror circuit.

16. A method for adjusting a reference current, the method comprising:

generating read data by comparing a read current from a memory cell to the reference current;

comparing the read data to one or more parameters used to store data within the memory cell; and adjusting the reference current based on said comparison.

17. The method as recited in claim 16, wherein said adjusting the reference current comprises changing a magnitude, a slope and a polarity of the reference current.

18. The method as recited in claim 16, wherein said adjusting the reference current comprises supplying one or more control signals to a current reference circuit used for generating the reference current, the current reference circuit comprising a plurality of resistors providing variable resistance and a plurality of transistors providing variable current density.

19. The method as recited in claim 18, wherein said adjusting the reference current comprises supplying the one or more control signals to at least one of the plurality of resistors for varying the resistance provided thereby.

20. The method as recited in claim 18, wherein said adjusting the reference current comprises supplying the one or more control signals to at least one of the plurality of transistors for varying the current density provided thereby.

\* \* \* \* \*